METHOD OF FORMING SEMICONDUCTOR JUNCTIONS, BY
ETCHING, MASKING, AND DIFFUSION
Filed Jan. 7, 1966

United States Patent Office 3,498,853

Patented Mar. 3, 1970

3,498,853
METHOD OF FORMING SEMICONDUCTOR JUNCTIONS, BY ETCHING, MASKING, AND DIFFUSION

Joachim Dathe, Munich, Wolfgang Müller, Vaterstetten, and Shib Ghosh-Dastidar, Munich, Germany, assignors to Siemens Aktiengesellschaft, a corporation of Germany Filed Jan. 7, 1966, Ser. No. 519,237
Claims priority, application Germany, Jan. 13, 1965, S 94,987
Int. Cl. H011 7/44
U.S. Cl. 148—187 12 Claims

ABSTRACT OF THE DISCLOSURE

Described is the method of producing semiconductor components whereby the removal of material from the surface of a silicon semiconductor body is sequentially followed by indiffusion of doping material. The method comprises placing the silicon semiconductor body to be treated and doping material source at segregated localities within an evacuable reaction vessel, evacuating the reaction vessel, heating said vessel at the locality of the semiconductor body to an elevated temperature sufficiently high to vaporize the impurities contained on the surface of the semiconductor body, maintaining said elevated temperature until a layer from 0.5 to 5.0$\mu$ is removed, increasing the temperature of the semiconductor body and passing an oxidizing reaction gas over the semiconductor body, thereafter passing a reducing reaction gas first over the doping material source and then over the semiconductor body to transport the doping material via a gaseous phase onto the surface of the semiconductor body, diffusing the transported doping material into the semiconductor body and abruptly interrupting the flow of the reducing reaction gas to stop the diffusion process.

In the production of high-quality semiconductor components or devices, it is imperative that no contaminations reach the semiconductor bodies at any time during the entire production process.

In the heretofore techniques used, the semiconductor crystal was first subjected to a mechanical treatment for removal of surface material. This is followed by a chemical etching process. Thereafter, the semiconductor crystals were placed into other treatment vessels for subsequent processing steps, e.g. indiffusion of doping materials.

In these previously used techniques in which a liquid etchant was used to remove surface material and to purify the surface, the strong and uneven removal of the surface and the formation of inorganic and organic residues had detrimental effects caused by the necessary after-treatment.

It is an object of our invention to eliminate these disadvantages for the purpose of producing semiconductor devices.

According to our invention, the purification, that is removal of the semiconductor surface, and the indiffusion of the doping material are sequentially carried out within one reaction vessel without interruption. The semiconductor bodies, which are in the shape of wafers, slices or discs, and the doping material, are placed at segregated localities within an evacuated reaction vessel. The reaction vessel is subsequently evacuated, and heated to a temperature, sufficiently high to vaporize the impurities contained on the semiconductor surface. This elevated temperature condition is maintained until a sufficient removal ensues. The semiconductor surface, thereafter, is oxidized by passing thereover an oxygen-containing reaction gas. A second reaction gas, which has a reducing effect, which converts the doping material into a gaseous phase, is passed sequentially over the dopant and semiconductor to transport the dopant onto the semiconductor surface where it diffuses into the semiconductor body. This may also be done in a separate processing step. The diffusion process is now terminated abruptly, by discontinuing the gas supply.

The doping material used may be a compound, which is reduced by the gas converting it into the gaseous phase. An example of such a compound is $Ga_2O_3$. The doping material may also be a compound, which at adequately high temperature, converts undissociated into the gaseous phase. $B_2O_3$ is among these compounds.

During the removal process, it is preferable to heat the part of the reaction vessel containing the semiconductor wafers at a temperature of approximately 1100° C., while heating the part containing the doping material to a temperature of approximately 800° C. This temperature gradient in the reaction vessel may be achieved by using two separate furnaces. A vacuum pump is used to adjust the gas pressure within the reaction vessel during the removal process to about $10^{-3}$ to $5.10^{-5}$ torr. The removal process is continued until a layer of desired thickness is removed. Such thickness is from about 0.5 to 5$\mu$.

The first and the second reaction gas may preferably be introduced in opposite directions. That is, in such a way that the first reaction gas flows from the semiconductor platelets (wafers) to the doping material, whereas the second reaction gas flows from the doping material to the semiconductor platelets. However, the first and the seocnd reaction gas may also be introduced so that their flow directions are the same, that is, flowing from the doping material to the semiconductor platelets. The first reaction gas, containing oxygen, may be an inert gas, e.g. argon, with an addition of water vapor or oxygen. Hydrogen is applicable as the second, reducing gas. Similarly, a mixture of hydrogen and water vapor is also suitable.

It is advantageous, that the reaction vessel is maintained at a temperature of 1100–1200° C. during the passage of the first oxygen-containing gas. It is preferable to increase the temperature from the lowest to the highest value during this period. During the passage of the second gas (the reducing gas), in which the vaporization and indiffusion of the doping material ensues, the reaction vessel is favorably maintained at a temperature of about 1200° C.

By adjusting the diffusion period, the depth of penetration of the doping material may be varied. A penetration depth of 18$\mu$ was found favorable in the special instance. The flow rate of the reaction gas is adjusted to approximately 0.5–2 l./min.

A particularly favorable embodiment of our invention provides that platelets of semiconductor material be coated following the diffusion process, with an oxide layer, by passing a reaction gas containing oxygen, or pure oxygen.

According to a further development of the invention, when removal and doping of the semiconductor surface is to be limited only to given surface areas, it is advantageous to cover the semiconductor surface partly with an oxide layer. This may be effected by completely coating the semiconductor bodies with an oxide layer of approximately 0.75$\mu$ by an oxygen flow, at about 1200° C. The oxide layer is partially removed, according to a given pattern, by applying photolithogaphy or photoresist technique. The partially masked semiconductors are then subjected to a purification process followed by indiffusion of a doping material.

Our invention is suitable for the production of semiconductor components, such as transistors, rectifiers and the like. It may also be utilized for the production of integrated circuits.

Additional details of the invention may be derived from the example, which also describes the figures in which.

Figure 1:
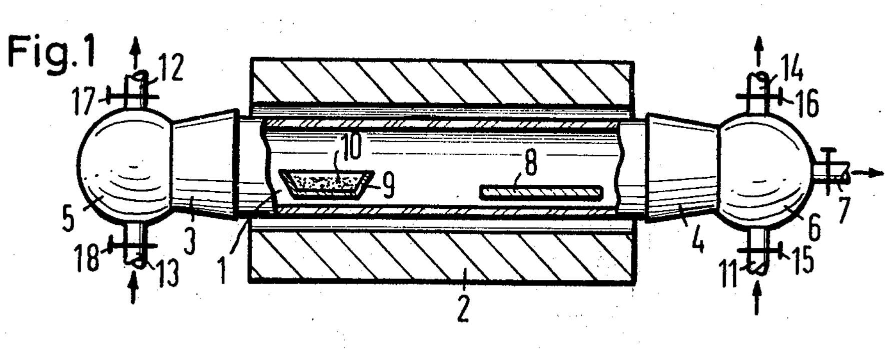
FIG. 1 shows an apparatus in which dopant is introduced into the semiconductor body.

With the aid of the device of FIG. 1, it is possible to carry out, with in the same reaction vessel, the purification of the semiconductor surface, the subsequent oxidation and the diffusion of doping material in shortly spaced operation steps, whereby the semiconductors remain out of contact with the outside air between steps.

The quartz reaction vessel 1 is located within furnace 2, for bringing the vessel to the required temperature. The furnace is provided with two heating coils, which may be heated separately, so that a temperature gradient may be established within the furnace. The tubular reaction vessel 1 is capped at its ends 3 and 4 by valve heads 5 and 6. A connection 7 is provided on head 6 for connecting the reaction vessel with a vacuum pump, not disclosed. Doping material 10, such as gallium oxide, is placed within a platinum or quartz boat 9. The boat and silicon platelets are inserted into the reaction tube 1.

Valve heads 5 and 6 are provided with means for abruptly interrupting the gas supply and abruptly reversing the flow direction of the gas. Magnetic valves are particularly suitable for this purpose. It is possible, by using one such valve 15, to introduce an inert gas containing a small percentage of water into the reaction vessel through the opening 11. The inert gas traverses the tube-shaped reaction vessel 1 and leave it at the opening 12. Upon cessation of the inert gas supply, a reducing gas, in this case hydrogen gas, is synchronously introduced into the reaction vessel through opening 13 and emerges through opening 14. Valves 15–18 are used to open or close the input and output openings.

To produce an n-p-n silicon power transistor, a polished silicon disc 8 is inserted into the reaction vessel. A plurality of discs may be used. At the same time, the quartz boat 9, which contains highly pure $Ga_2O_3$ 10 is inserted into the furnace. The tube-shaped reaction vessel is evacuated to $5 \cdot 10^{-5}$ torr. After this pressure is reached, the silicon wafers are heated to approximately 1100° C., the $Ga_2O_3$ to 800° C. These temperature conditions are maintained for one hour, as a result of which the vaporization depths amounts to about 5$\mu$, and the roughness depth to 0.5$\mu$. The silicon surface, purified in this manner, is subsequently provided with an oxide layer. This is achieved by introducting argon containing a slight addition of water vapor into the reaction vessel through tube 11. The argon first flows over the silicon disc or wafer 8 and then over the doping material 10 and is removed through the opening 12. Oxidation takes place approximately for one hour at 1100° C. The silicon is then heated to 1200° C. and, at this temperature, is subjected for another two hours to the action of the moist argon. The argon input is abruptly stopped by magnetic valve 15, and synchronously the hydrogen valve 13 is opened. Moist hydrogen flows at a rate of about 1.5 l./min., in the opposite direction, through the reaction vessel. The hydrogen first flows over the doping material 10, then over the semiconductor disc 8 and is finally removed through the opening 14. The hydrogen stream reduces the $Ga_2O_3$ to volatile GaO and is transported as such to the surface of the silicon disc. After diffusion for ten hours at 1200° C., the gallium penetrates to a depth of 18$\mu$. Following the diffusion process, the hydrogen valve is automatically closed and at the same time, argon valve 11 is reopened. This results in an abrupt interruption of the transport process and thus, diffusion of the gallium into the silicon.

Figure 2:
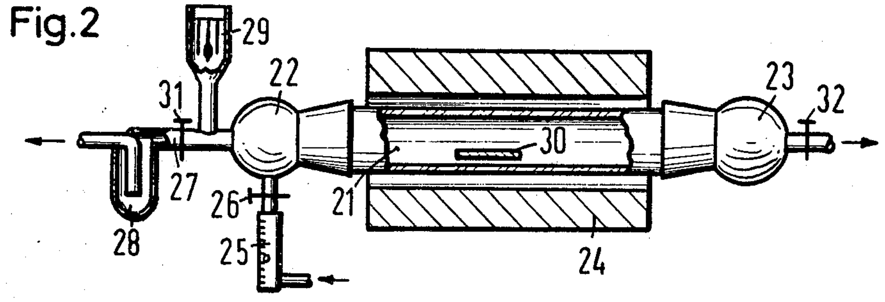
FIG. 2 shows an apparatus in which a partially coated semiconductor body is treated.

FIG. 2 illustrates apparatus for the purification and doping of semiconductor discs which are partially coated with an oxide layer. The semiconductor discs, which are previously mechanically polished and chemically pre-purified, for example the silicon discs 30, are first of all provided with an oxide layer. A tubular quartz reaction vessel 21, which is equipped at its ends with valve head 22 for introducing and 23 for removing the reaction gas, is placed into a furnace 24. The reaction vessel 21 is connected with an oxygen container, not shown, through valve head 22. Flow meter 25 measures the oxygen flow rate. The gas input is adjusted by small valve 26. Furthermore, the reaction vessel is equipped with valve 31 to a high vacuum pump, not shown. Cooling trap 28 is inserted into the line 27 in order to remove any possible moisture. A Penning measuring tube 29 is inserted between valve head 22 and valve 31 for the purpose of measuring the pressure.

The silicon discs 30, which are to be coated with an oxide layer, are placed into the reaction vessel. The vessel is evacuated to a pressure of about $10^{-5}$ torr. Subsequently, the furnace is heated to 1100° C. and maintained at this temperature for one half hour while remaining evacuated. The vacuum valve 31 is then closed and oxygen valve 26 is opened to produce a slight oxygen overpressure in the reaction vessel. The output valve 32 is then opened. The oxygen flow rate, which is measured by the flow meter 25, is adjusted to a value of at least 1.5 liters/min. The temperature is kept at 1200° C. during the oxygen addition, the length of which is adjusted to the required thickness of the oxide layer. In the present embodiment, which relates to the production of a silicon n-p-n transistor, a layer of approximately 0.75$\mu$ thick was obtained after ten hours.

Figure 3:
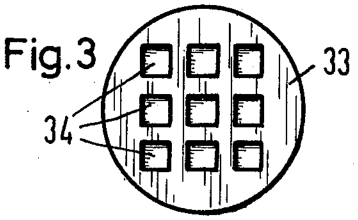
FIG. 3 shows an arrangement of treated spots on a wafer.

The oxide layer is subsequently partially removed by using photolithography. Thus, semiconductor discs 33 may be produced, whose arrangement of non-coated localities 34 corresponds approximately to that shown in FIG. 3.

Figure 4:
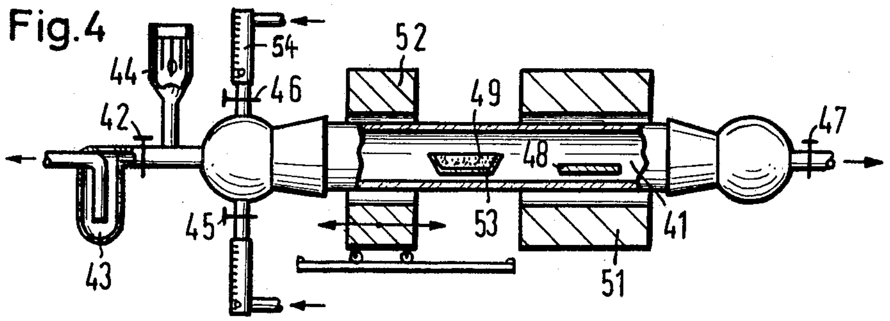
FIG. 4 shows a diffusion and coating apparatus.

The thus pre-treated silicon discs are placed into the diffusion apparatus shown in FIG. 4. The tubular quartz reaction vessel 41 is connected to a high vacuum pump, not shown. Cooling trap 43 is between valve 42 and the vacuum pump to remove any possible moisture. The pressure is measured by a Penning measuring tube 44. The reaction vessel is equipped with valves 45 for introduction of oxygen, 46 for introduction of inert gas, and 47 for exhausting gases. Furnace 51 and 52 provide a variable heating of the semi-conductor discs 48 and the doping source 49 within the reaction vessel 41. Furnace 51 is stationary, while fur nace 52 may be displaced as shown by the arrow along the reaction vessel. This prevents premature vaporization of the doping material 49 contained in boat 53. In this instance, the doping material is boron oxide.

The silicon discs (wafers) 48, which are partially covered with an oxide layer, are placed into the diffusion apparatus. Also within said apparatus is platinum boat 53, containing the doping material 49, boron oxide. With valves 45, 46 and 47 closed, the reaction vessel is evacuated to a pressure of $10^{-5}$ torr. Furnace 51 is then heated to a temperature of 1100° C. and furnace 52 to a temperature of 900° C. During the heating process, furnace 52 is displaced, so that the dopant 49 is not heated. This prevents the premature vaporization of the boron oxide. Evacuation takes place for 15 minutes while the pump is in operation. Vacuum valve 42 is then closed and inert gas, e.g. nitrogen or argon, is introduced through valve 46. Flow meter 54 measures the inert gas flow rate which is about 0.5 l./min. Furnace 52 is now displaced to heat the doping source to vaporization temperature of the boron oxide. After an approximately two hour diffusion period, a penetration depth of about 3.5μ is obtained. The diffusion process is abruptly interrupted by switching from inert gas to oxygen, while displacing furnace 52 to stop heating the doping source. The ensuing oxidation is continued until an oxide layer of requisite thickness is formed on the uncoated localities. The semiconductor discs, which were thus doped and provided with an oxide layer, may now be subjected to further operational steps for the purpose of producing transistors or diodes.

One can use, for instance, a rapidly energizable electric furnace as an alternative to the movable furnace 52, although the latter provides faster changes in its heating characteristics. Obviously many modifications and variations of the present invention are possible in the light of the above teachings. It is therefore to be understood that within the scope of the appended claims, the invention may be practiced otherwise then as specifically described.

We claim:

1. The method of producing semiconductor components whereby the removal of material from the surface of a silicon semiconductor body is sequentially followed by indiffusion of doping material, which comprises placing the silicon semiconductor body to be treated and doping material source selected from $Ga_2O_3$ and $B_2O_3$ at segregated localities within an evacuable reaction vessel, evacuating the reaction vessel, heating said vessel at the locality of the semiconductor body to 1100° C., which is an elevated temperature sufficiently high to vaporize the impurities contained on the surface of the semiconductor body, maintaining said elevated temperature until a layer from 0.5 to 5.0μ is removed, increasing the temperature of the semiconductor body to 1200° C. and passing an oxidizing reaction gas over the semiconductor body to form an oxidized coat thereon, thereafter passing a reducing reaction gas first over heated doping material source and then over the semiconductor body to transport the doping material via a gaseous phase onto the surface of the oxide coat of said semiconductor body, diffusing the transported doping material into the semiconductor body and abruptly stopping the heating and the flow of the reducing reaction gas to stop the diffusion of the doping impurity.

2. The process of claim 1, wherein the semiconductor is kept at 1100° C. and the doping material is kept at 800° C.

3. The process of claim 1, wherein the vessel is evacuated to a pressure of from $10^{-3}$ to $5 \cdot 10^{-5}$ torr.

4. The process of claim 1, wherein the oxidizing reaction gas in an inert gas containing water vapor.

5. The process of claim 1, wherein the reducing reaction gas is hydrogen.

6. The process of claim 1, wherein the oxidized semiconductor is maintained at about 1200° C. as the doping material is evaporated and indiffused into the semiconductor body, said indiffusion continuing until a penetration depth of about 18μ is reached with the reaction gases being introduced at from 0.5 l./min. to 2.0 l./min.

7. The process of claim 6, wherein subsequent to the diffusion process, an oxygen containing gas is passed over the semiconductor bodies whereby they are coated with an oxide layer.

8. The process of claim 7, wherein prior to the removal step the semiconductor body is initially coated with an oxide layer.

9. The process of claim 8, wherein the semiconductor body is completely coated with an oxide layer about 0.75μ, in an oxygen current at about 1200° C.

10. The process of claim 9, wherein the oxide layer is photolithographically removed according to a prescribed pattern.

11. The method for coating a silicon body by indiffusing doping material obtained from a gaseous phase into a silicon surface which is at least partly coated with a $SiO_2$ layer, said $SiO_2$ layer being produced on the silicon surface by the action of an oxidizing gas, at elevated temperature, which comprises placing the silicon crystal to be treated, into a processing vessel, evacuating said vessel and heating the silicon crystal to a temperature such that surface layer impurities on the semiconductor are removed by evaporation, thereafter replacing the vacuum with an oxidizing gas which oxidizes the exposed silicon surface, following the oxidation process, the silicon crystal coated with the $SiO_2$ layer is subjected in said vessel to a gallium containing atmosphere by passing a reducing reaction gas immediately after the completed oxidation of the surface of the silicon crystal, over a heated source of $Ga_2O_3$ which has been installed into the processing vessel at the same time as the silicon crystal, to supply gallium to the reaction gas and passing said gallium containing reaction gas across the silicon crystal to be doped.

12. The method of claim 11, wherein the diffusion process is stopped abruptly by interrupting the gas supply to the dopant gas.

References Cited

UNITED STATES PATENTS

| | | | |
|---|---|---|---|
| 3,145,447 | 8/1964 | Rummel | 148—174 X |
| 3,147,152 | 9/1964 | Mendel | 148—187 |
| 3,258,359 | 1/1966 | Hugle | 148—174 |
| 2,930,722 | 3/1960 | Ligenza | 156—17 X |
| 3,168,422 | 2/1965 | Allegretti | 117—200 X |
| 3,210,225 | 5/1965 | Brixey | 148—187 |
| 3,255,056 | 6/1966 | Flatley | 148—187 |
| 3,313,663 | 4/1967 | Tsu-Hsing Yeh et al. | 148—189 X |

HYLAND BIZOT, Primary Examiner

U.S. Cl. X.R.

148—189